United States Patent
Fry et al.

(10) Patent No.: US 7,986,580 B2
(45) Date of Patent: Jul. 26, 2011

(54) SELF-REFRESH BASED POWER SAVING CIRCUIT AND METHOD

(75) Inventors: James Fry, Aurora (CA); George Guthrie, Mississauga (CA)

(73) Assignee: ATI Technologies ULC, Markham, Ontario (CA)

( * ) Notice: Subject to any disclaimer, the term of this patent is extended or adjusted under 35 U.S.C. 154(b) by 47 days.

(21) Appl. No.: 12/339,768

(22) Filed: Dec. 19, 2008

(65) Prior Publication Data

US 2010/0157711 A1   Jun. 24, 2010

(51) Int. Cl.
*G11C 7/00*   (2006.01)
(52) U.S. Cl. .................................. 365/222; 365/230.06
(58) Field of Classification Search .................. 365/222, 365/230.06
See application file for complete search history.

(56) References Cited

U.S. PATENT DOCUMENTS

| | | | | |
|---|---|---|---|---|
| 6,832,177 B2 * | 12/2004 | Khandekar et al. | ........... | 702/186 |
| 7,019,553 B2 * | 3/2006 | Blodgett et al. | ................ | 326/30 |
| 7,459,930 B2 * | 12/2008 | Mei | .................... | 326/30 |
| 7,633,310 B2 * | 12/2009 | Fukushi | ......................... | 326/30 |
| 2008/0168262 A1 * | 7/2008 | Bellows et al. | ............... | 712/225 |

* cited by examiner

*Primary Examiner* — Viet Q Nguyen
(74) *Attorney, Agent, or Firm* — Vedder Price P.C.

(57) ABSTRACT

A circuit includes a memory interface control circuit and a self-refresh adjustable impedance driver circuit having at least one adjustable impedance circuit. The memory interface control circuit selectively provides an impedance control signal based on memory self-refresh information. The self-refresh adjustable impedance driver circuit adjusts an impedance value of the adjustable impedance circuit in response to the impedance control signal. In addition, the self-refresh adjustable impedance driver circuit provides a memory interface signal based on the memory self-refresh information.

23 Claims, 4 Drawing Sheets

SELF-REFRESH BASED POWER SAVING CIRCUIT AND METHOD

FIELD

The present disclosure generally relates to synchronous dynamic access memory, and more particularly, to reducing power consumption of circuits that communicate with synchronous dynamic access memory.

BACKGROUND

Reducing power consumption of circuits and systems continues to be a difficult but necessary task particularly for circuits used in mobile devices such as laptop devices, handheld devices and other mobile and non-mobile devices. In addition, advances in technology create an increased demand for power consumption in order implement performance improvements afforded by the advances in technology. In many instances, the performance needs of applications implemented by the circuits are variable depending on the context of the application.

For example, when a synchronous dynamic access memory (SDRAM) circuit is not being accessed (e.g., read/write access), the SDRAM circuit can operate in a self-refresh mode. When in the self-refresh mode, the SDRAM circuit uses it own timer to generate internal refresh cycles. As such, a memory controller associated with the SDRAM circuit does not need to provide a clock signal to the SDRAM circuit and therefore can power down memory controller circuits that provide the clock signal when the SDRAM circuit is in the self-refresh mode.

However, some memory controller circuits cannot be powered down when the SDRAM circuit is in the self-fresh mode. The JEDEC Standard (JESD79C), which is hereby incorporated by reference in its entirety, requires a clock enable signal (CKE) to be provided to the SDRAM circuit when it is in both the self-fresh mode and a normal mode of operation. More specifically, the JEDEC Standard requires the clock enable signal to be a logical low while the SDRAM circuit is in the self-refresh mode. When the clock enable signal transitions to a logical high, the SDRAM circuit exits the self-refresh mode and enters the normal mode of operation.

Accordingly, a need exists for a circuit and method to further reduce power consumption in connection with SDRAM circuits while complying with the JEDEC standard.

BRIEF DESCRIPTION OF THE DRAWINGS

The disclosure will be more readily understood in view of the following description when accompanied by the below figures, wherein like reference numerals represent like elements.

DETAILED DESCRIPTION

Figure 1:
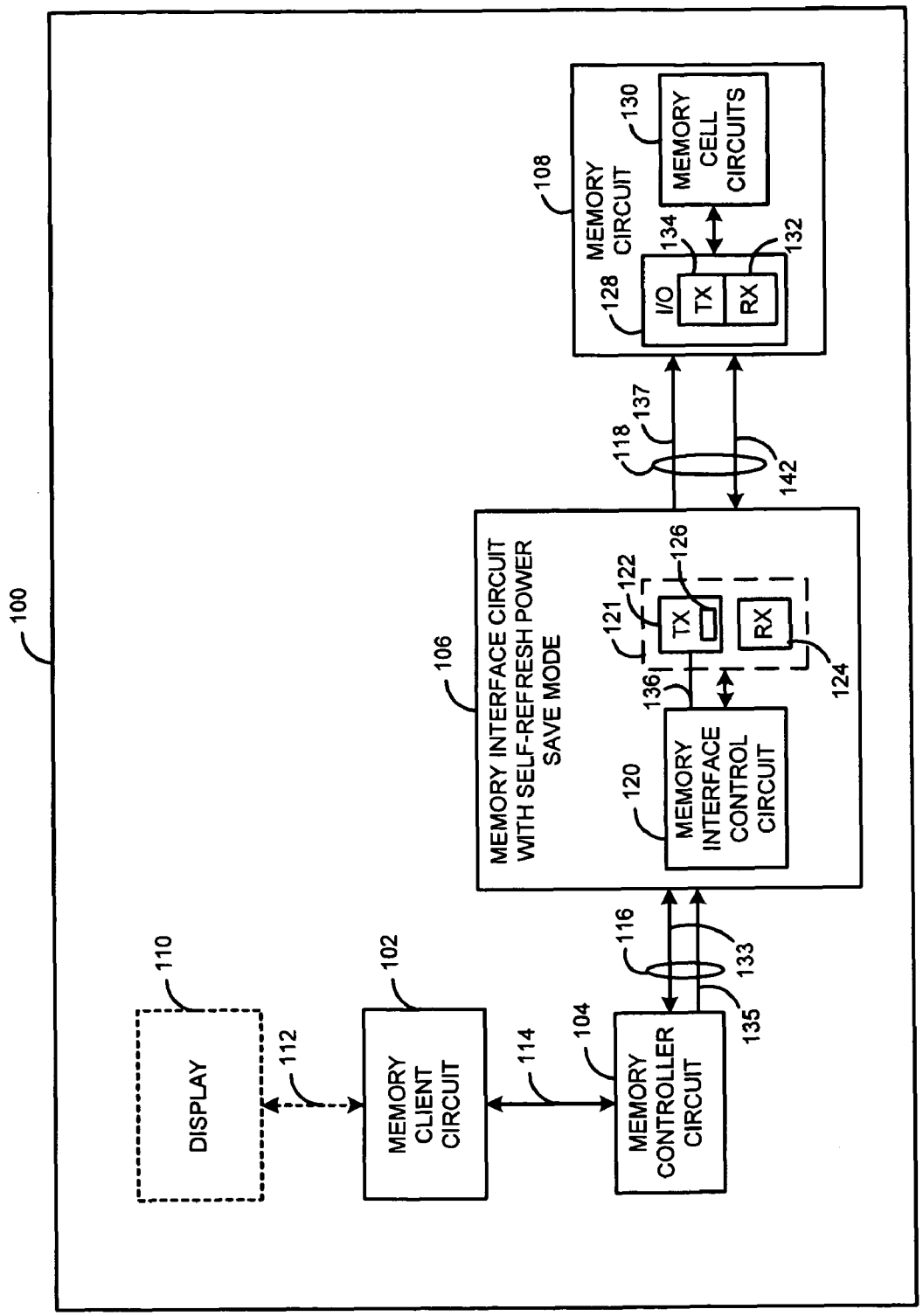
FIG. 1 is an exemplary functional block diagram of a device that includes a memory interface circuit.

In one example, a circuit includes a memory interface control circuit and a self-refresh adjustable impedance driver circuit having at least one adjustable impedance circuit. The memory interface control circuit selectively provides an impedance control signal based on memory self-refresh information. The self-refresh adjustable impedance driver circuit adjusts an impedance value of the adjustable impedance circuit in response to the impedance control signal. In addition, the self-refresh adjustable impedance driver circuit provides a memory interface signal based on the memory self-refresh information. A related method is also disclosed.

Among other advantages, the circuit and method exhibit reduced power consumption by selectively adjusting the impedance value of the adjustable impedance circuit based on memory self-refresh information. In addition, the circuit and method can provide one or more suitable memory interface signals when the impedance value is adjusted in order to comply with suitable SDRAM memory standards. Other advantages will be recognized by those of ordinary skill in the art.

In one example, the self-refresh adjustable impedance driver circuit increases the impedance value in response to the impedance control signal. The memory interface control circuit provides the impedance control signal when the memory self-refresh information indicates a memory self-refresh mode.

In one example, the circuit includes a memory circuit. The memory circuit selectively operates a memory self-refresh mode or a normal mode based on at least the memory interface signal. The circuit can also include a memory controller circuit, operatively coupled to the self-refresh adjustable impedance driver circuit. The memory controller circuit provides the memory self-refresh information.

In one example, the circuit includes a memory client circuit operatively coupled to the memory controller circuit. The memory controller circuit transfers data between the memory client circuit and the memory circuit.

In one example, the self-refresh adjustable impedance driver circuit includes an output terminal, a first impedance circuit, and the adjustable impedance circuit. The output terminal provides the memory interface signal. The first impedance circuit is operatively coupled to a first voltage source and the output terminal. The adjustable impedance circuit is operatively coupled to the output terminal and a second voltage source. The second voltage source is less than the first voltage source.

In one example, wherein the self-refresh adjustable impedance driver circuit includes a first switch circuit and a second switch circuit. The first switch circuit allows current flow between the first voltage source and the output terminal in response to a first switch control signal. The second switch circuit allows current flow between the second voltage and the output terminal in response to a second switch control signal.

In one example, the memory interface control circuit selectively provides the first switch control signal or the second switch control signal based on the memory self-refresh information.

As used herein, the term "circuit" can include an electronic circuit, one or more processors (e.g., shared, dedicated, or group of processors such as but not limited to microprocessors, DSPs, or central processing units) and memory, that execute one or more software or firmware programs, combinational logic circuits, an ASIC, and/or other suitable components that provide the described functionality. A "circuit" can be "powered down" by reducing power to a desired reduced power level including to a level rendering it inoperative. Additionally, as will be appreciated by those of ordinary skill in the art, the operation, design, and organization, of a "circuit" can be described in a hardware description language such as Verilog™, VHDL, or other suitable hardware description languages.

Referring now to FIG. 1, an exemplary functional block diagram of a device 100 such as a laptop computer, stationary computer, handheld computing device, mobile telephone, handheld media device, and/or other suitable device is depicted. The device 100 includes a memory client circuit 102, a memory controller circuit 104, a memory interface circuit with a self-refresh power save mode 106, and a memory circuit 108. In addition, in some embodiments, the device 100 can also include a display 110 for displaying graphic and/or video information 112 received from the memory client circuit 102.

The memory client circuit 102 can comprise any suitable circuit such as a graphics processing circuit (or core), central processing circuit (or core), or other suitable circuit. The memory controller circuit 104 can be any suitable memory control circuit known in the art. The memory circuit 108 can be any suitable memory circuit having a self-refresh mode of operation such as a synchronous dynamic random access memory (SDRAM) circuit or any other suitable memory circuit having a self-refresh mode of operation.

The memory client circuit 102 communicates with the memory controller circuit 104 via interface 114. The memory controller circuit 104 communities with the memory interface circuit 106 via interface 116. The memory interface circuit 106 communicates with the memory circuit via interface 118. The interfaces 114, 116 and 118 can be any suitable interface to facilitate communication between the circuits such as one or more bus circuits for example.

The memory interface circuit 106 includes a memory interface control circuit 120 and a memory interface transceiver circuit 121 having a memory interface transmitter circuit 122 and a memory interface receiver circuit 124. The memory interface transmitter circuit 122 includes a self-refresh adjustable impedance driver circuit 126. The memory circuit 108 includes a memory input-output (I/O) circuit 128 and one or more memory cell circuits 130. The memory I/O circuit 128 includes a memory receiver circuit 132 and a memory transmitter circuit 134.

The memory controller circuit 104 transfers data 133 between the memory client circuit 102 and the memory interface circuit 106 via interfaces 114 and 116. In addition, the memory controller circuit 104 controls various operations of the memory circuit 108. More specifically, the memory controller circuit 104 provides a memory controller command signal 135 to the memory interface circuit 106. In response to the memory controller command signal 135, the memory interface circuit 106 provides one or more memory interface signals 137 via interface 118. The memory interface signals 137 can include command information, control information, clock information, address information, and/or other suitable memory interface information.

As such, the memory controller circuit 104 can send the memory controller command signals 135 to the memory interface circuit 106, which provides the memory interface signals 137 based thereon, in order to read data from the memory circuit 108 via interface 116, write data to the memory circuit 108 via interface 116, control the memory circuit 108 to enter a self-refresh mode of operation (e.g., in order to refresh the memory cells circuit 130), and/or other suitable memory operations as known in the art. In addition, the memory interface circuit 106 transfers data information 142 between the memory interface circuit 106 and the memory circuit 108. Furthermore, the memory interface circuit 106 transfers strobe information (not shown) between the memory interface circuit 106 and the memory circuit 108 as known in the art.

The memory interface control circuit 120 selectively provides an impedance control signal 136 based on the memory controller command signal 135. More specifically, the memory interface control circuit 120 selectively provides an impedance control signal 136 based on memory self-refresh information included in the memory controller command signal 135. In response to the impedance control signal 136, the self-refresh adjustable impedance driver circuit 126 adjusts an internal impedance value. In addition, the self-refresh adjustable impedance driver circuit 126 provides the memory interface signal 137 based on the memory self-refresh information included in the memory controller command signal 135.

In one embodiment, the memory interface control circuit 120 provides the impedance control signal 136 when the memory self-refresh information indicates that the memory circuit 108 is to operate in a self-refresh mode of operation. In response to the impedance control signal 136, the self-refresh adjustable impedance driver circuit 126 increases its internal impedance value. As a result, the self-refresh adjustable impedance driver circuit 126 consumes less power when providing the one or more memory interface signals 137, which in turn reduces power consumption the memory interface circuit 106. In addition, in this embodiment, the self-refresh impedance driver circuit 126 provides the memory interface signals 137 to control the memory circuit 108 into the self-refresh mode of operation, which in turn refreshes the memory cells circuits 130.

When the memory self-refresh information indicates that the memory circuit 108 is to operate in a normal mode of operation (e.g., any suitable mode of operation other than self-refresh), the memory interface control circuit 120 can discontinue providing the impedance control signal 136. In response thereto, the self-refresh adjustable impedance driver circuit 126 can decrease its impedance value.

Although, the self-refresh adjustable impedance driver circuit 126 increases the impedance value in response to the memory interface control circuit 120 providing the impedance control signal 138 in this example, the self-refresh adjustable impedance driver circuit 126 can decrease the impedance value in response to the memory interface control circuit 120 providing the impedance control signal 136 if desired or vice versa. Similarly, the impedance value can be increased and/or decreased when the impedance control signal represents a logical high and/or a logical low or vice versa.

Figure 2:
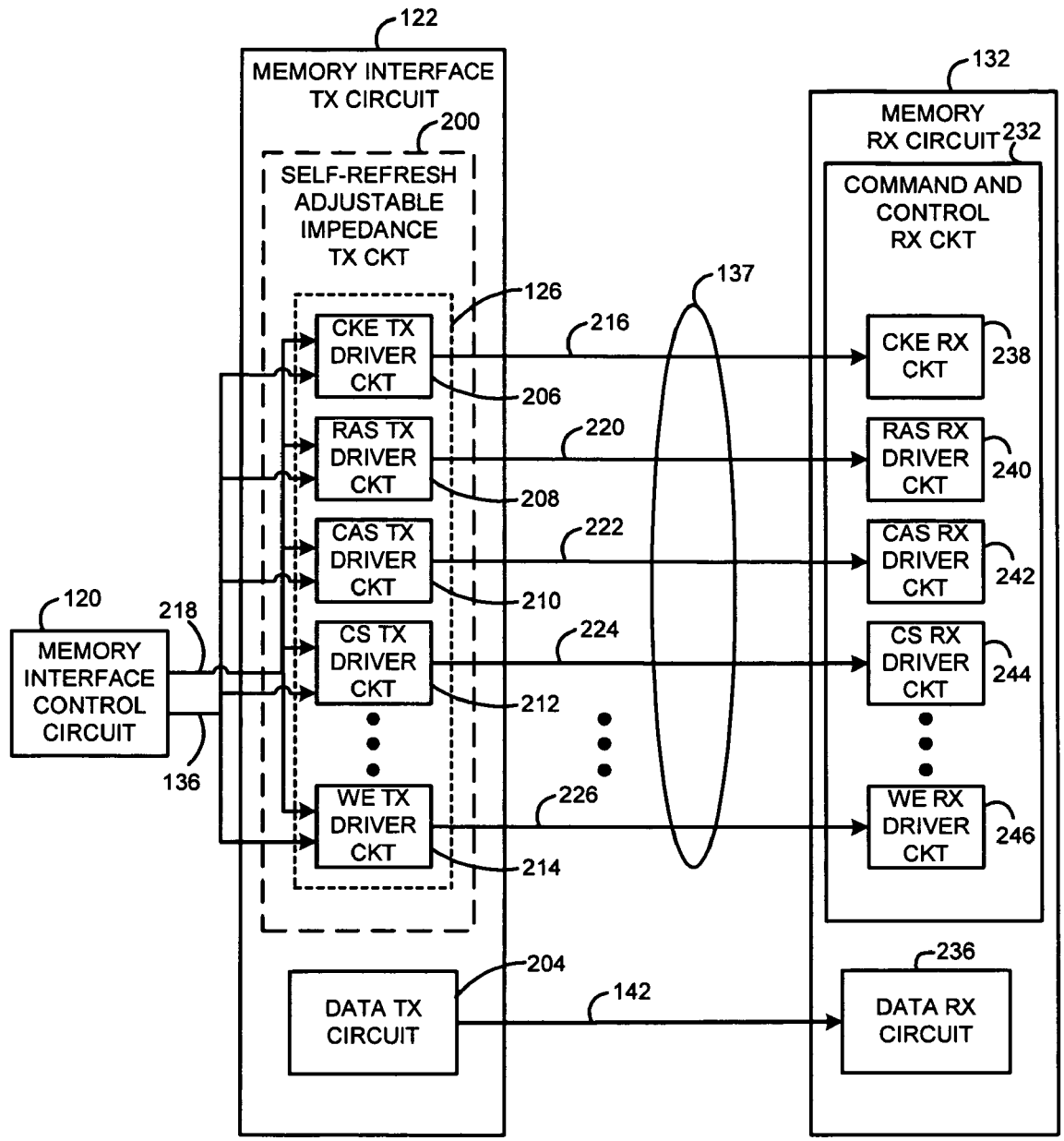
FIG. 2 is an exemplary functional block diagram of a memory interface transmitter circuit of the memory interface circuit.

Referring now to FIG. 2, an exemplary functional block diagram of the memory interface transmitter circuit 122 and the memory receiver circuit 132 is depicted. The memory interface transmitter circuit 122 includes a self-refresh adjustable impedance transmitter circuit 200 and a data transmitter circuit 204. The self-refresh adjustable impedance transmitter circuit 200 includes the self-refresh adjustable impedance driver circuit 126. In this example, the self-refresh adjustable impedance driver circuit 126 comprises a plurality of self-refresh adjustable impedance driver circuits. More specifically, in this example, the self-refresh adjustable impedance driver circuit 126 includes a clock enable (CKE) self-refresh adjustable impedance driver circuit 206, an RAS self-refresh adjustable impedance control circuit 208, a CAS self-refresh adjustable impedance control circuit 210, a CS self-refresh adjustable impedance control circuit 212, and a WE self-refresh adjustable impedance control circuit 214.

Although, the self-refresh adjustable impedance driver circuit 126 includes multiple self-refresh adjustable impedance driver circuits 206-214 in this example, one or more of the self-refresh adjustable impedance driver circuits 206-214 can be replaced with a standard driver circuit (e.g., without an adjustable impedance) as known in the art if desired. However, it is desirable that at least one of the circuits 206-212 be a self-refresh adjustable impedance driver circuit. For example, according to the JEDEC standard (JESD79C), which is hereby incorporated by reference in its entirety, a clock enable (CKE) signal must be provided as a logical low to the memory circuit 108 in order to enter into (and remain in) the self-refresh mode of operation. As such, it may be desirable in some embodiments to adjust the impedance of the CKE self-refresh adjustable impedance circuit 206 and power down the other circuits 208-214 when the memory circuit 108 is operating in the self-refresh mode in order to reduce power consumption of the memory interface circuit 106.

The CKE self-refresh adjustable impedance circuit 206 provides a CKE signal 216 in response to a control signal 218 received from the memory interface control circuit 120. The RAS self-refresh adjustable impedance circuit 208 provides a RAS signal 220 in response to the control signal 218 received from the memory interface control circuit 120. The CAS self-refresh adjustable impedance circuit 210 provides a CAS signal 222 in response to the control signal 218 received from the memory interface control circuit 120. The CS self-refresh adjustable impedance circuit 212 provides a CS signal 224 in response to the control signal 218 received from the memory interface control circuit 120. The WE self-refresh adjustable impedance circuit 214 provides a WE signal 226 in response to the control signal 218 received from the memory interface control circuit 120. The data transmitter circuit 204 provides data information 230 in response to the control signal 218 received from the memory interface control circuit 120.

The memory receiver circuit 132 includes a command and control receiver circuit 232 and a data receiver circuit 236. The command and control receiver circuit 232 includes a CKE receiver circuit 238, an RAS receiver circuit 240, a CAS receiver to circuit 242, a CS receiver circuit 244, a WE receiver circuit 246. The CKE receiver circuit 238 receives the CKE signal 216. The RAS receiver circuit 240 receives the RAS signal 220. The CAS receiver circuit 242 receives the CAS signal 222. The CS receiver circuit 244 receives the CS signal 224. The WE receiver circuit 246 receives the WE signal 226. The data receiver circuit 236 receives the data information 230.

As noted above, the memory interface control circuit 120 selectively provides the impedance control signal 136 based on the memory self-refresh information. In response to the impedance control signal 136, each of the self-refresh adjustable impedance circuits 206-214 adjusts a respective impedance. For example, when the memory self-refresh information indicates a self-refresh mode of operation, the self-refresh adjustable impedance circuits 206-214 can increase their respective impedances or vice versa. In addition, when the memory self-refresh information indicates a normal mode of operation (e.g., a mode of operation other than self-refresh), the self-refresh adjustable impedance circuits 216-214 can decrease their respective impedances or vice versa.

Figure 3:
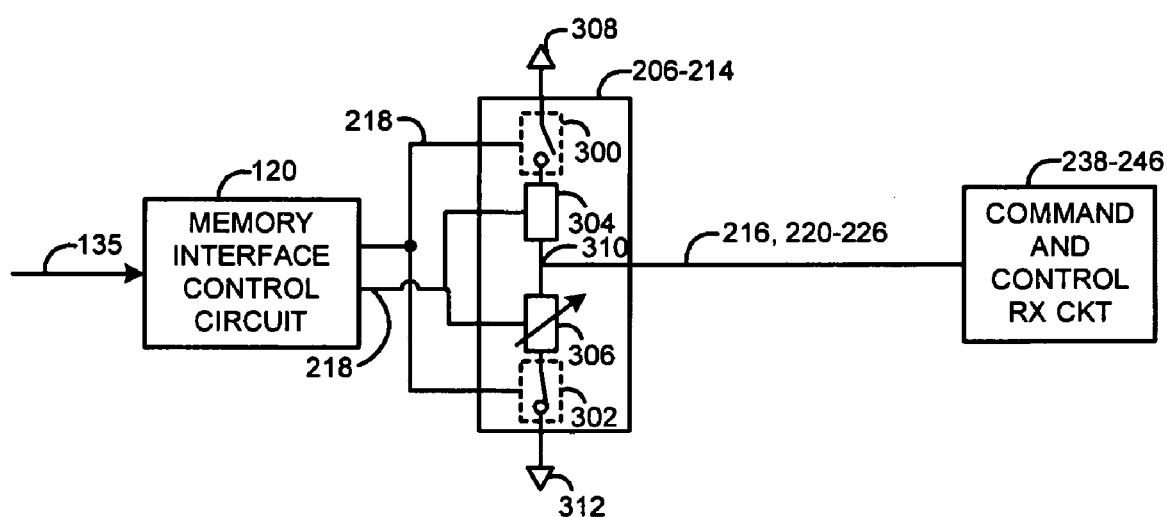
FIG. 3 is an exemplary functional block diagram of a self-refresh adjustable impedance driver circuit of the memory interface transmitter circuit.

Referring now FIG. 3, an exemplary functional block diagram of the self-refresh adjustable impedance circuit 206-214 is depicted. The impedance control circuit 206-214 includes a first switch circuit 300, a second switch circuit 302, a first impedance circuit 304, and an adjustable impedance circuit 306. The first and second switch circuit 300, 302 can be any suitable switching circuit such as a MOSFET transistor for example. The first impedance circuit 304 can have impedance value of approximately 15-40 Ohms although other values are contemplated. The adjustable impedance circuit 306 can be any suitable adjustable impedance circuit capable of being adjusted to at least two different impedance values. In one example, the adjustable impedance circuit 306 can adjust between approximately 15-40 Ohms to approximately 120 Ohms although other values are contemplated.

The first switch circuit 300 is operatively coupled to a first voltage source 308 and the first impedance circuit 304, which is operatively coupled to an output terminal 310. The second switch 302 is operatively coupled to a second voltage source 312 and the adjustable impedance circuit 306 which is operatively coupled to the output terminal 310. The first voltage source 308 provides a first voltage that is higher than a second voltage provided by the second voltage source 312.

The memory interface control circuit 120 controls the first and second switch circuits 300, 302 via the control signal 218. For example, if the memory interface control circuit 120 is to transmit a logical high signal, the memory interface control circuit 120 can close the first switch circuit 300 and open the second switch circuit 302. As such, in this example, when the first switch circuit 300 is closed, the first switch circuit 300 allows current flow from the first voltage source 308 to the output terminal 310, which pulls the signal 216, 220-226 to the first voltage resulting in a logical high.

Similarly, if the memory interface control circuit 120 is to transmit a logical low signal, the memory interface control circuit 120 can close the second switch circuit 302 and open the first switch circuit 300. As such, in this example, when the second switch circuit 302 is closed, the second switch circuit 302 allows current flow from the second voltage source 312 to the output terminal 302, which pulls the signal 216, 220-226 to the second voltage resulting in a logical low.

In addition, the memory interface control circuit 120 controls the adjustable impedance circuit 306 based on memory self-refresh information included in the memory controller command signal 135. More specifically, the memory interface control circuit 120 selectively provides the impedance control signal 136 based on the memory self-refresh information. In response to the impedance control signal 136, the adjustable impedance circuit 306 increases its impedance value or vice versa. In one example, the adjustable impedance circuit 306 increases its impedance value from approximately 15-40 Ohms to approximately 120 Ohms however other values are contemplated. Increasing the impedance value of the adjustable impedance circuit 306, decreases current flow between the second voltage source 312 and the output terminal 310, which in turn reduces power consumption of the driver circuit.

Figure 4:
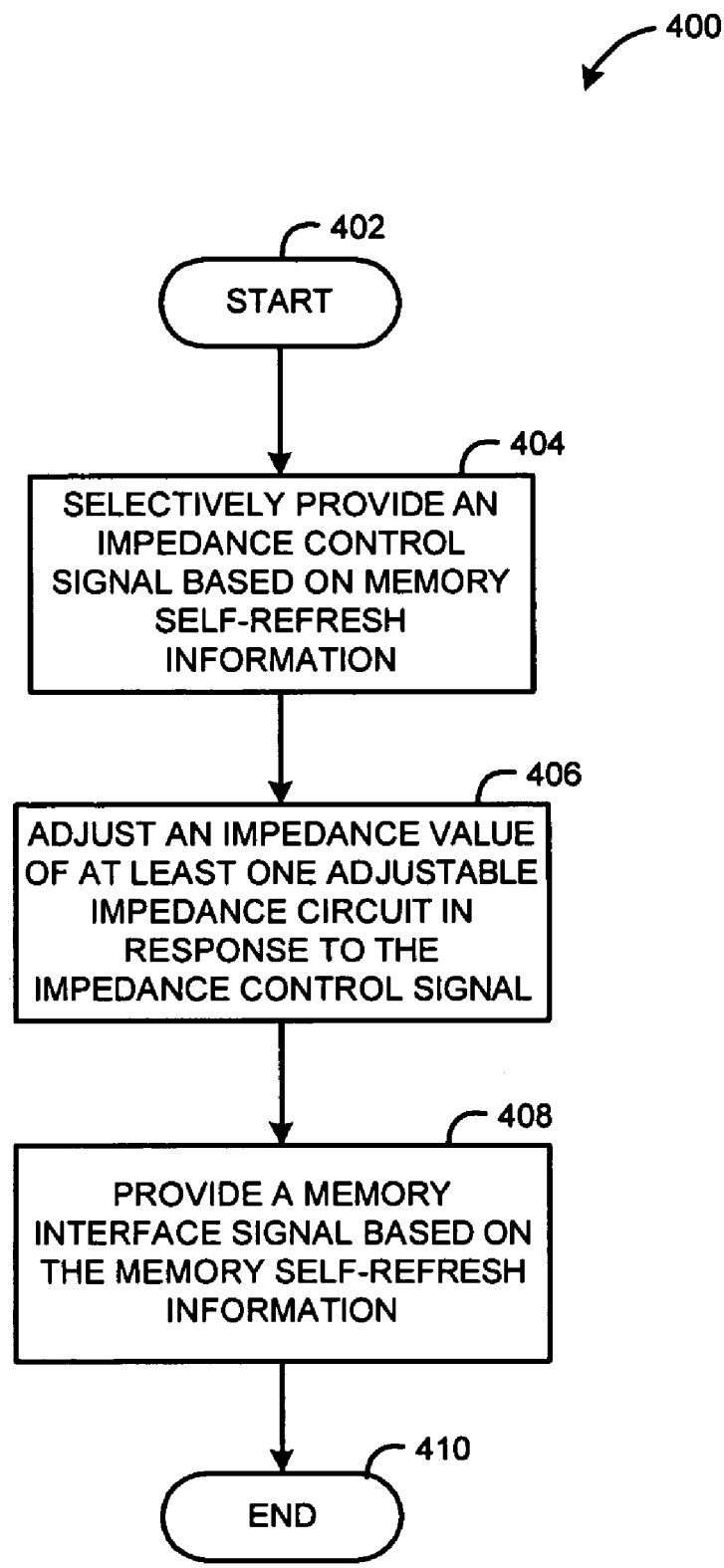
FIG. 4 is a flowchart depicting exemplary operations that can be performed by the memory interface circuit.

Referring now to FIG. 4, exemplary operations that can be performed by the self-refresh adjustable impedance driver circuit 206-214 are generally identified of 400. The process starts at 402. At 404, the memory interface control circuit 120 selectively provides the impedance control signal 136 based on the memory self-refresh information included in the memory controller command signal 135. At 406, the self-refresh adjustable impedance driver circuit 206-214 adjusts the impedance value in response to the impedance control signal 136. At 408, the self-refresh adjustable impedance driver circuit 206-214 provides at least one memory interface signal 216, 220-226. The process ends at 410.

As noted above, among other advantages, the self-refresh adjustable impedance driver circuit 126 exhibits reduced power consumption by selectively adjusting the impedance value of the adjustable impedance circuit 306 based on the memory self-refresh information included in the memory controller command signal 135. In addition, the self-refresh adjustable impedance driver circuit 126 can provide one or more suitable memory command signals 216, 220-226 while the impedance value is adjusted in order to comply with the JEDEC Standard memory standard. Other advantages will be recognized by those of ordinary skill in the art.

Also, integrated circuit design systems (e.g., work stations) are known that create integrated circuits based on executable information stored on a computer readable memory such as but not limited to CDROM, RAM, other forms of ROM, hard drives, distributed memory etc. The information may include data representing (e.g., compiled or otherwise represented) any suitable language such as, but not limited to, hardware descriptor language or other suitable language. As such, the circuits and/or modules described herein can also be produced as integrated circuits by such systems. For example, an integrated circuit can be created for use in a display using information stored on a computer readable medium that when executed cause the integrated circuit design system to create an integrated circuit includes a circuit identification storage module and a control module. The circuit identification storage module stores circuit identification information. The control module receives the circuit identification information. In response to the circuit identification information, the control module selectively performs a secure boot procedure or a test boot procedure. Integrated circuits having a circuit and/or module that performs other operations described herein may also be suitable produced.

While this disclosure includes particular examples, it is to be understood that the disclosure is not so limited. Numerous modifications, changes, variations, substitutions, and equivalents will occur to those skilled in the art without departing from the scope of the present disclosure upon a study of the drawings, the specification, and the following claims.

What is claimed is:

1. A circuit, comprising:
    a memory interface control circuit that is operative to selectively provide an impedance control signal based on memory self-refresh information; and
    a self-refresh adjustable impedance driver circuit comprising at least one adjustable impedance circuit, wherein the driver circuit is operative to: adjust an impedance value of the at least one adjustable impedance circuit in response to the impedance control signal; and to provide a memory interface signal based on the memory self-refresh information.

2. The circuit of claim 1 wherein the self-refresh adjustable impedance driver circuit is operative to increase the impedance value in response to the impedance control signal.

3. The circuit of claim 1 wherein the memory interface control circuit is operative to provide the impedance control signal when the memory self-refresh information indicates a memory self-refresh mode.

4. The circuit of claim 1 further comprising a memory circuit that is operative to selectively operate in one of a memory self-refresh mode and a normal mode based on at least the memory interface signal.

5. The circuit of claim 4 further comprising a memory controller circuit, operatively coupled to the self-refresh adjustable impedance driver circuit, that is operative to provide the memory self-refresh information.

6. The circuit of claim 5 further comprising a memory client circuit, operatively coupled to the memory controller circuit, wherein the memory controller circuit is operative to transfer data between the memory client circuit and the memory circuit.

7. The circuit of claim 1 wherein the self-refresh adjustable impedance driver circuit comprises:
    an output terminal that is operative to provide the memory interface signal;
    a first impedance circuit operatively coupled to a first voltage source and the output terminal; and
    the at least one adjustable impedance circuit operatively coupled to the output terminal and a second voltage source that is less than the first voltage source.

8. The circuit of claim 7 wherein the self-refresh adjustable impedance driver circuit further comprises:
    a first switch circuit that is operative to allow current flow between the first voltage source and the output terminal in response to a first switch control signal; and
    a second switch circuit that is operative to allow current flow between the second voltage and the output terminal in response to a second switch control signal.

9. The circuit of claim 8 wherein the memory interface control circuit is operative to selectively provide one of the first switch control signal and the second switch control signal based on the memory self-refresh information.

10. A method, comprising:
    selectively providing an impedance control signal based on memory self-refresh information; and
    adjusting an impedance value of at least one adjustable impedance circuit in response to the impedance control signal; and
    providing a memory interface signal based on the memory self-refresh information.

11. The method of claim 10 further comprising increasing the impedance value in response to the impedance control signal.

12. The method of claim 10 further comprising providing the impedance control signal when the memory self-refresh information indicates a memory self-refresh mode.

13. The method of claim 10 further comprising selectively operating a memory circuit in one of a self-refresh mode and a normal mode based on at least the command enable signal.

14. A device, comprising:
    a display;
    a memory client circuit operatively coupled to the display;
    a memory controller circuit, operatively coupled to the memory client, that is operative to provide memory self-refresh information;
    a memory interface control circuit that is operative to selectively provide an impedance control signal based on the memory self-refresh information; and
    a self-refresh adjustable impedance driver circuit comprising at least one adjustable impedance circuit, wherein the driver circuit is operative to: adjust an impedance value of the at least one adjustable impedance circuit in response to the impedance control signal; and to provide a memory interface signal based on the memory self-refresh information.

15. The circuit of claim 14 wherein the self-refresh adjustable impedance driver circuit is operative to increase the impedance value in response to the impedance control signal.

16. The circuit of claim 14 wherein the memory interface control circuit is operative to provide the impedance control signal when the memory self-refresh information indicates a memory self-refresh mode.

17. The circuit of claim 14 further comprising a memory circuit that is operative to selectively operate in one of a memory self-refresh mode and a normal mode based on at least the command enable signal.

18. The circuit of claim 14 wherein the self-refresh adjustable impedance driver circuit comprises:
    an output terminal that is operative to provide the memory interface signal;

a first impedance circuit operatively coupled to a first voltage source and the output terminal; and the at least one adjustable impedance circuit operatively coupled to the output terminal and a second voltage source that is less than the first voltage source.

19. The circuit of claim 18 wherein the self-refresh adjustable impedance driver circuit further comprises:

a first switch circuit that is operative to allow current flow between the first voltage source and the output terminal in response to a first switch control signal; and a second switch circuit that is operative to allow current flow between the second voltage and the output terminal in response to a second switch control signal.

20. The circuit of claim 19 wherein the memory interface control circuit is operative to selectively provide one of the first switch control signal and the second switch control signal based on the memory self-refresh information.

21. A computer readable medium comprising information that when executed by at least one processor causes the at least one processor to:

at least one of: operate, design, and organize a circuit that comprises:

a memory interface control circuit that is operative to selectively provide an impedance control signal based on memory self-refresh information; and a self-refresh adjustable impedance driver circuit comprising at least one impedance circuit, wherein the self-refresh adjustable impedance driver circuit is operative to: adjust an impedance value of the at least one impedance circuit in response to the impedance control signal; and to provide a memory interface signal based on the memory self-refresh information.

22. The computer readable medium of claim 21 wherein the information comprises hardware description language.

23. The circuit of claim 1 wherein the self refresh adjustable impedance driver circuit is adapted to transmit memory interface signals to memory.

* * * * *